US012598778B2

(12) United States Patent
Zhu

(10) Patent No.: US 12,598,778 B2
(45) Date of Patent: Apr. 7, 2026

(54) SEMICONDUCTOR DEVICE, METHOD FOR MANUFACTURING SEMICONDUCTOR DEVICE, AND ELECTRONIC APPARATUS INCLUDING THE SEMICONDUCTOR DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS. CHINESE ACADEMY OF SCIENCES, Beijing (CN)

( * ) Notice: Subject to any disclaimer, the term of this patent is extended or adjusted under 35 U.S.C. 154(b) by 665 days.

(21) Appl. No.: 17/777,811

(22) PCT Filed: Oct. 20, 2020

(86) PCT No.: PCT/CN2020/122114
§ 371 (c)(1),
(2) Date: May 18, 2022

(87) PCT Pub. No.: WO2021/103854
PCT Pub. Date: Jun. 3, 2021

(65) Prior Publication Data
US 2022/0416047 A1      Dec. 29, 2022

(30) Foreign Application Priority Data

Nov. 29, 2019    (CN) ......................... 201911210061.X

(51) Int. Cl.
H10D 30/67          (2025.01)
H10D 62/10          (2025.01)
(Continued)

(52) U.S. Cl.
CPC ..... *H10D 30/6735* (2025.01); *H10D 30/6757* (2025.01); *H10D 62/112* (2025.01);
(Continued)

(58) Field of Classification Search
CPC ........... H10D 30/6735; H10D 30/6757; H10D 62/112; H10D 62/121; H10D 64/018; H10D 64/258; H01L 21/26513
See application file for complete search history.

(56) References Cited

U.S. PATENT DOCUMENTS 9,806,191 B1 *  10/2017  He ......................... H10D 30/63
10,263,100 B1    4/2019  Bi et al.
(Continued)

FOREIGN PATENT DOCUMENTS

CN        102117833 A      7/2011
CN        102664189 A      9/2012
(Continued)

OTHER PUBLICATIONS

Search Report and Written Opinion dated Jan. 26, 2021 for International Patent Application No. PCT/CN2020/12114, 9 pages.
(Continued)

*Primary Examiner* — Fernando L Toledo
*Assistant Examiner* — Marshall Mu-Nuo Hatfield
(74) *Attorney, Agent, or Firm* — Christopher R. Christenson; Kelly, Holt & Christenson, P.L.L.C.

(57)        ABSTRACT

The present disclosure provides a semiconductor device, a method for manufacturing the semiconductor device, and electronic equipment including the semiconductor device. According to embodiments, a semiconductor device may include a channel portion, source/drain portions in contact with the channel portion on opposite sides of the channel portion, and a gate stack intersecting the channel portion. The channel portion includes a first part extending in a
(Continued)

Figure 1:
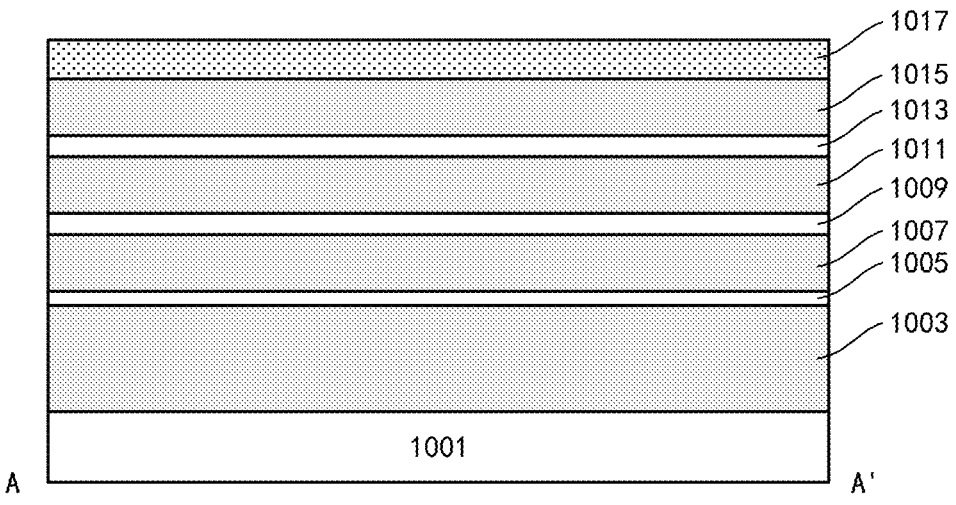

vertical direction relative to the substrate and a second part extending from the first part in a lateral direction relative to the substrate.

25 Claims, 23 Drawing Sheets

(51) Int. Cl.

| | |
|---|---|
| *H10D 64/01* | (2025.01) |
| *H10D 64/23* | (2025.01) |
| *H10P 30/20* | (2026.01) |

(52) U.S. Cl.

CPC ......... *H10D 62/121* (2025.01); *H10D 64/018* (2025.01); *H10D 64/258* (2025.01); *H10P 30/204* (2026.01); *H10P 30/21* (2026.01)

(56) References Cited

U.S. PATENT DOCUMENTS

| | | | |
|---|---|---|---|
| 2016/0172498 A1 | 6/2016 | Cheng et al. | |
| 2016/0211377 A1 | 7/2016 | Cheng et al. | |
| 2017/0309708 A1 | 10/2017 | Eng et al. | |
| 2018/0331232 A1 | 11/2018 | Frougier et al. | |
| 2018/0366545 A1* | 12/2018 | Deng | H10D 64/661 |
| 2019/0148376 A1* | 5/2019 | Chanemougame | |
| | | | H10D 30/6219 |
| | | | 257/532 |
| 2019/0172755 A1* | 6/2019 | Smith | H10D 30/6735 |
| 2019/0304974 A1* | 10/2019 | Sharma | H10D 84/0195 |
| 2019/0304976 A1* | 10/2019 | Zhu | H10D 30/797 |
| 2019/0326286 A1 | 10/2019 | Xie et al. | |
| 2019/0348403 A1 | 11/2019 | Mochizuki et al. | |
| 2020/0273979 A1* | 8/2020 | Xie | H10D 30/62 |
| 2020/0343361 A1* | 10/2020 | Cheng | H10D 30/6212 |
| 2021/0134952 A1* | 5/2021 | Fung | H10D 62/121 |

FOREIGN PATENT DOCUMENTS

| | | |
|---|---|---|
| CN | 110021667 A | 7/2019 |
| CN | 110189997 A | 8/2019 |
| CN | 209199928 U | 8/2019 |
| CN | 209401628 U | 9/2019 |
| CN | 111048588 A | 4/2020 |
| CN | 111106111 A | 5/2020 |
| CN | 111106176 A | 5/2020 |
| CN | 111584486 A | 8/2020 |
| EP | 3389095 A1 | 10/2018 |

OTHER PUBLICATIONS

First Office Action for Chinese application No. 201911210061.X, Dated Feb. 1, 2021, 25 pages including English translation.
First Office Action for Chinese Taiwan application No. 109115087, Mar. 11, 2021, 4 pages.
Second Office Action for Chinese Taiwan application No. 109115087, Dated Jul. 7, 2021, 2 pages.
First Office Action for Korean application No. 10-2021-7028772, Dated May 16, 2023, 13 pages including English translation.
Office Action for German Patent Application No. 112020005848.4, dated Mar. 27, 2024, 20 pages including English Translation.

\* cited by examiner 1017
1015
1013
1011
1009
1007
1005
1003
1019
1001
A                                                                    A‘

1017
1015
1013
1011
1009
1007
1019
1021
1001
A                                                                    A‘

1029

1027

1025

1021

空

1001

A                                                                                    A'

1031

1029

1027

1033

1025
1025

1013

1025
1025

1027

1009

1025

1027

1005

1001

C                    C'

1031    1029
        1027
1025    1013
1025
1025    1027
1025    1009
1025    1027
        1005
        1035

1001

C                    C'

1031    1029
        1027

1019

1023

1001

D                    D'

1031
1029
1027
1025
1025
1037
1025
1025
1025
1013
1027
1009
1027
1005
1035
1001
C
C'

1029
1027
1025
1035
1001
A
A'

1031    1029
1027
1039
1019
1001
D    D'

1027
1025
1035
1001
A    A'

SEMICONDUCTOR DEVICE, METHOD FOR MANUFACTURING SEMICONDUCTOR DEVICE, AND ELECTRONIC APPARATUS INCLUDING THE SEMICONDUCTOR DEVICE

CROSS-REFERENCE TO RELATED APPLICATION

The application is a Section 371 National Stage Application of International Application No. PCT/CN2018/110,866, filed on Oct. 20, 2020, which claims priority to the Chinese Patent Application No. 201911210061.X, filed on Nov. 29, 2019, entitled "SEMICONDUCTOR DEVICE, METHOD FOR MANUFACTURING SEMICONDUCTOR DEVICE, AND ELECTRONIC DEVICE INCLUDING THE SEMICONDUCTOR DEVICE", which is incorporated herein by reference in its entirety.

TECHNICAL FIELD

The present disclosure relates to the field of semiconductors, and more specifically, to a semiconductor device having a comb-like channel structure, a method for manufacturing a semiconductor device, and an electronic apparatus including the semiconductor device.

BACKGROUND

To deal with the challenge of further miniaturization of semiconductor devices, devices with various structures such as fin field effect transistors (FinFET), multi-bridge transistor field effect transistors (MBCFET), etc. have been proposed. For the FinFET, a height of a fin may be increased as the size of the FinFET decreases, so as to obtain sufficient driving current while reducing the area. However, excessive height of the fin causes a lot of problems, such as fin collapse, gap filling, etched topography control. For the MBCFET, for the purpose of gate metal filling, an interval between nanosheets included in the MBCFET cannot be further reduced, and a self-heating problem of the MBCFET becomes serious. In addition, unlike the FinFET, a height of the MBCFET cannot be used for enhancing device performance.

SUMMARY

In view of this, the purpose of the present disclosure is at least partly to provide a semiconductor device, a method for manufacturing a semiconductor device, and an electronic apparatus including the semiconductor device, in order to obtain a reliable performance when the apparatus is further reduced.

According to an aspect of the present disclosure, there is provided a semiconductor device including a channel portion, source/drain portions in contact with the channel portion on two opposite sides of the channel portion, and a gate stack intersecting the channel portion. The channel portion includes a first part extending in a vertical direction relative to a substrate and a second part extending from the first part in a lateral direction relative to the substrate.

According to another aspect of the present disclosure, there is provided a method for manufacturing a semiconductor device is provided, the method including: providing, on the substrate, a first sacrificial layer for a first isolation portion; providing, on the first sacrificial layer, a lamination of at least one second sacrificial layer for a gate stack alternated with at least one first active layer; patterning the first sacrificial layer and the lamination into a ridge-like structure extending in a first direction on the substrate; forming, on a sidewall at a side of the ridge-like structure in a second direction intersecting the first direction, a second active layer in contact with the first active layer; forming, on the substrate, a second isolation portion on a periphery of the ridge-like structure; remove the second sacrificial layer; forming, on the second isolation portion, the gate stack extending in the second direction to intersect the first active layer and the second active layer; removing a part of the first active layer and a part of the second active layer, which are exposed by the gate stack, to expose the first sacrificial layer; removing the first sacrificial layer; forming the first isolation portion in a space located directly under the gate stack, wherein the space is generated due to the removal of the first sacrificial layer; and forming, on both sides of the gate stack in the first direction on the substrate, source/drain portions in contact with the first active layer and the second active layer.

According to another aspect of the present disclosure, there is provided an electronic apparatus including the above described semiconductor device.

According to an embodiment of the present disclosure, the channel portion may be a comb-like structure. The first part of the channel portion may be similar to a fin in a FinFET, and the second part of the channel portion may be similar to a nanosheet in a nanosheet field effect transistor (FET) or a multi-bridge channel field effect transistor (MBCFET). Therefore, the semiconductor device according to the embodiment of the present disclosure may have advantages of both the FinET, and the nanosheet FET or the MBCFET. In the semiconductor device, a current driving capability may be provided by the first part and the second part of the channel portion at the same time, thereby improving the device performance and reducing the area. In addition, since the first part and the second part are coupled to each other, a mechanical stability in a manufacturing stage is high, for example, higher than the mechanical stability of the conventional MBCFET.

BRIEF DESCRIPTION OF THE ACCOMPANYING DRAWINGS

Figure 9:
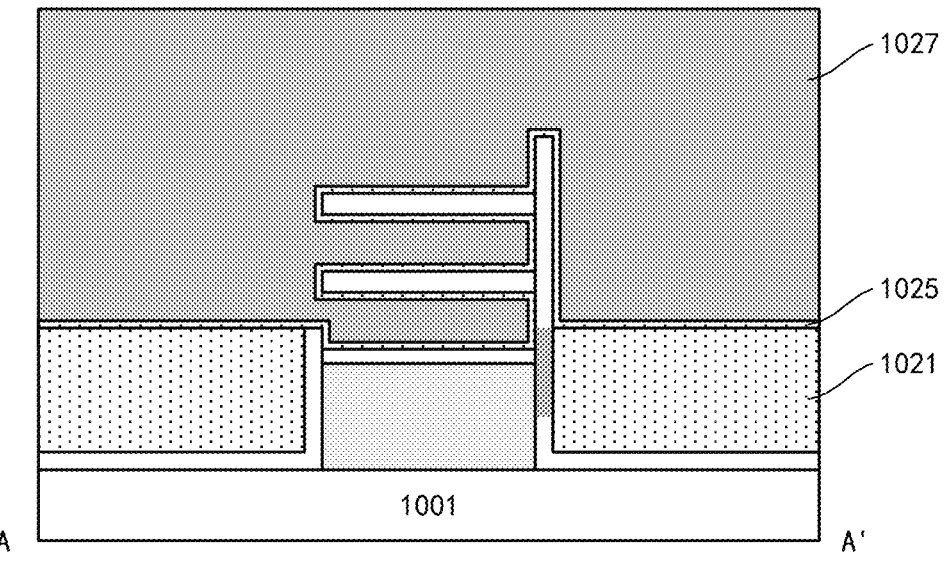
Figure 10A:
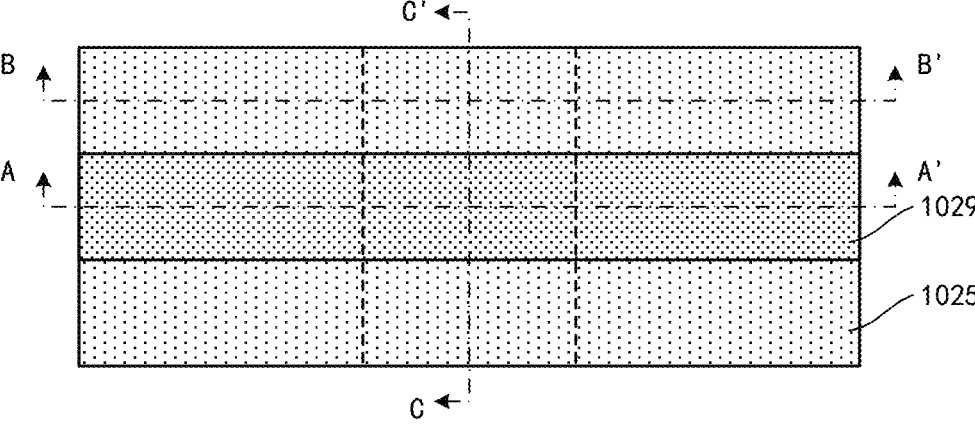
Figures 10B, 10C:
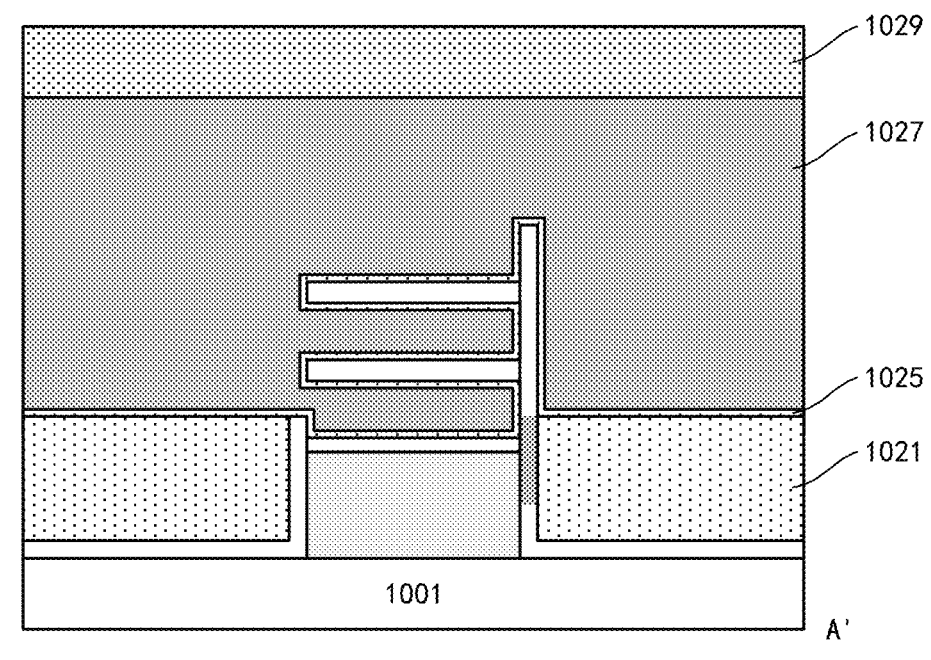
Figures 10D, 11A:
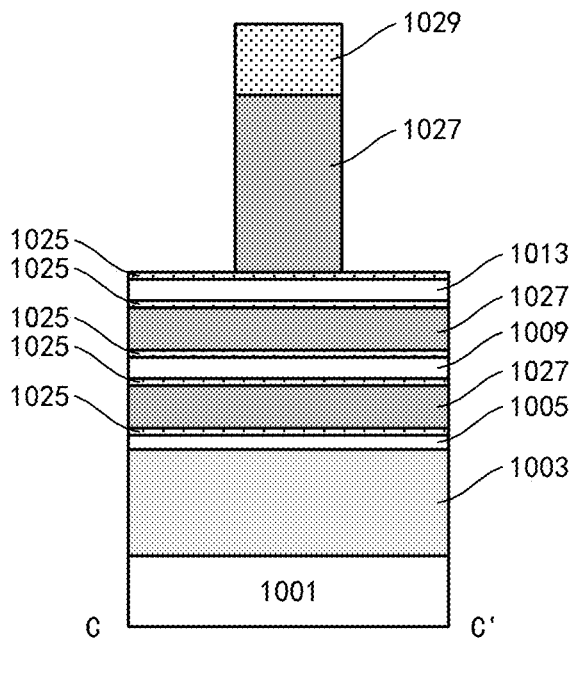
Figure 11B:
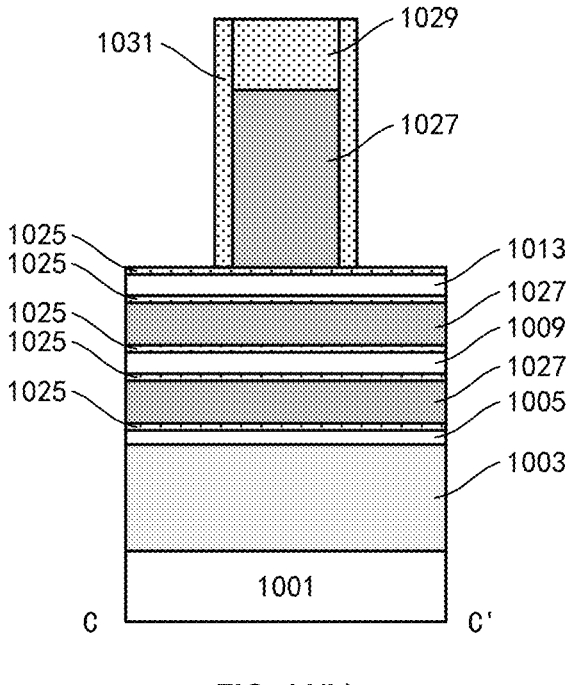
Figure 12A:
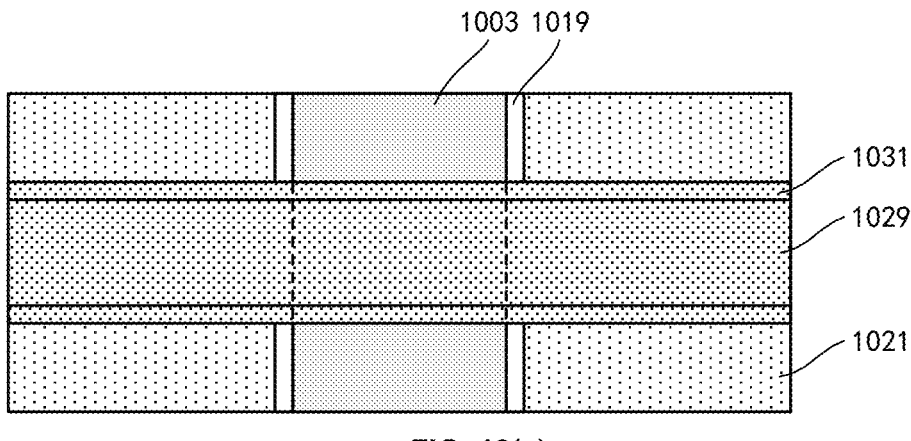
Figure 12B:
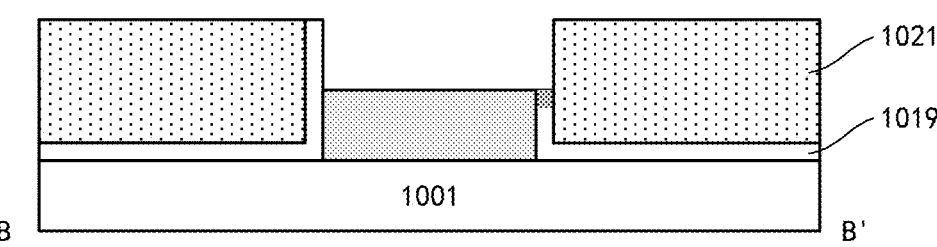
Figure 12C:
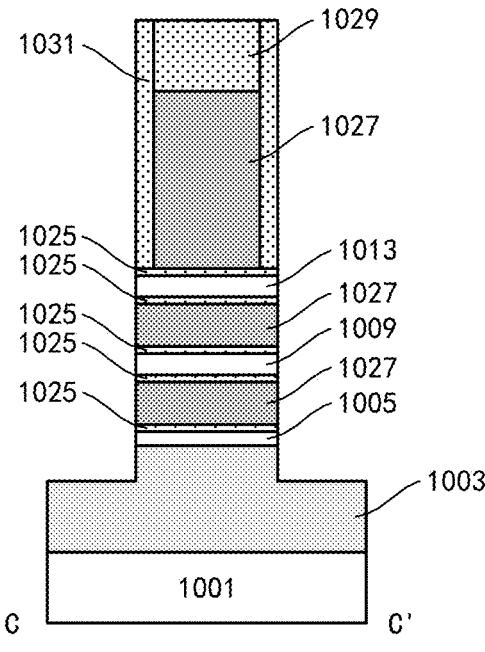
Figure 13A:
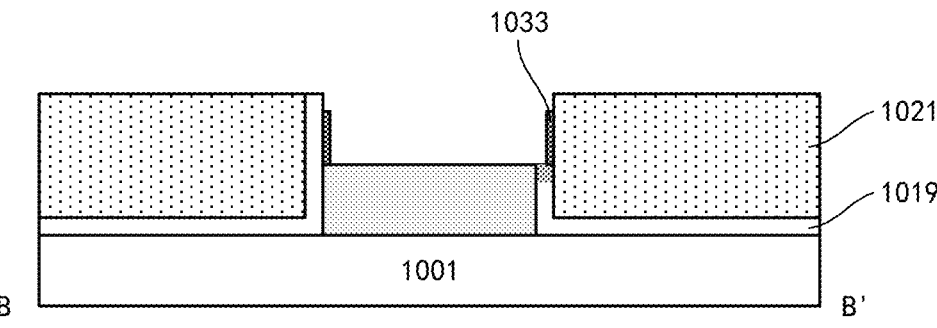
Figure 13B:
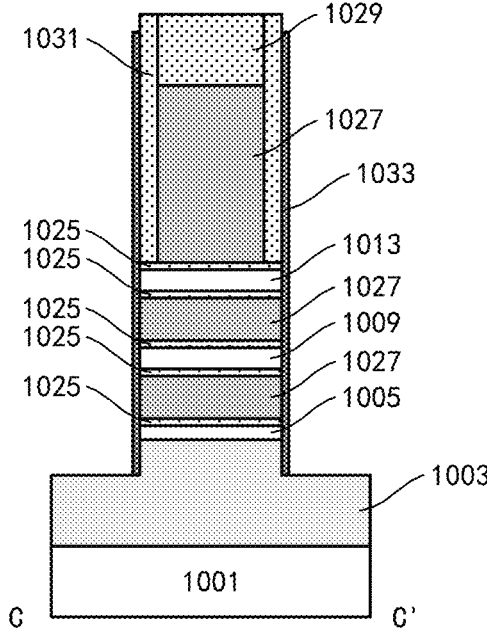
Figure 14A:
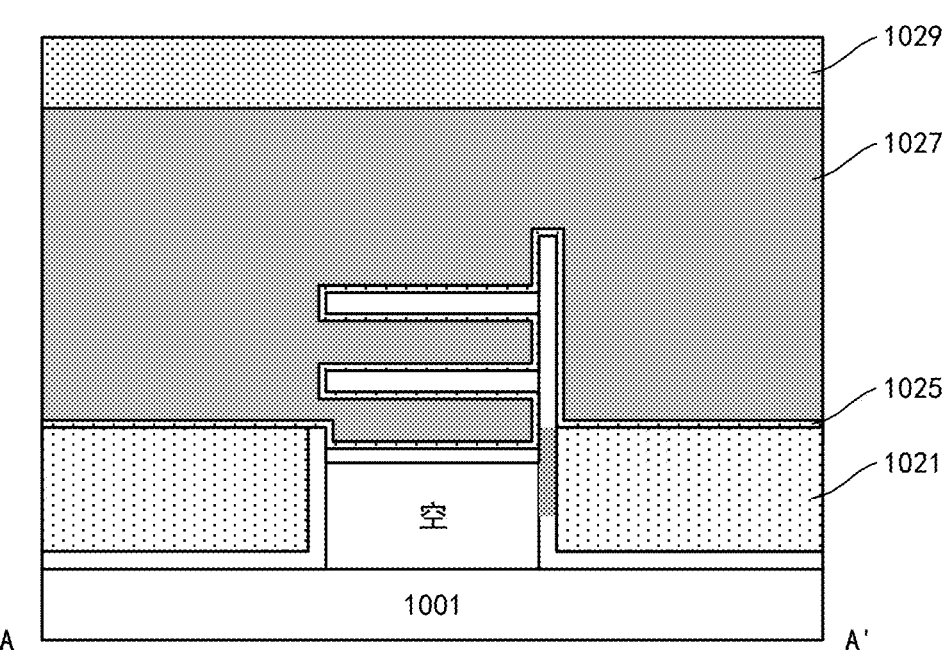
Figure 14B:
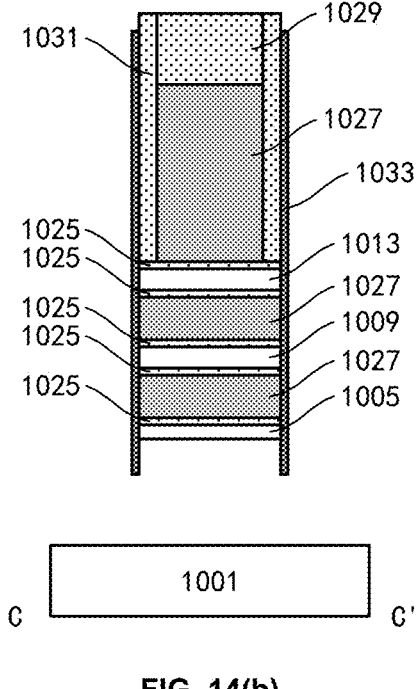
Figure 15A:
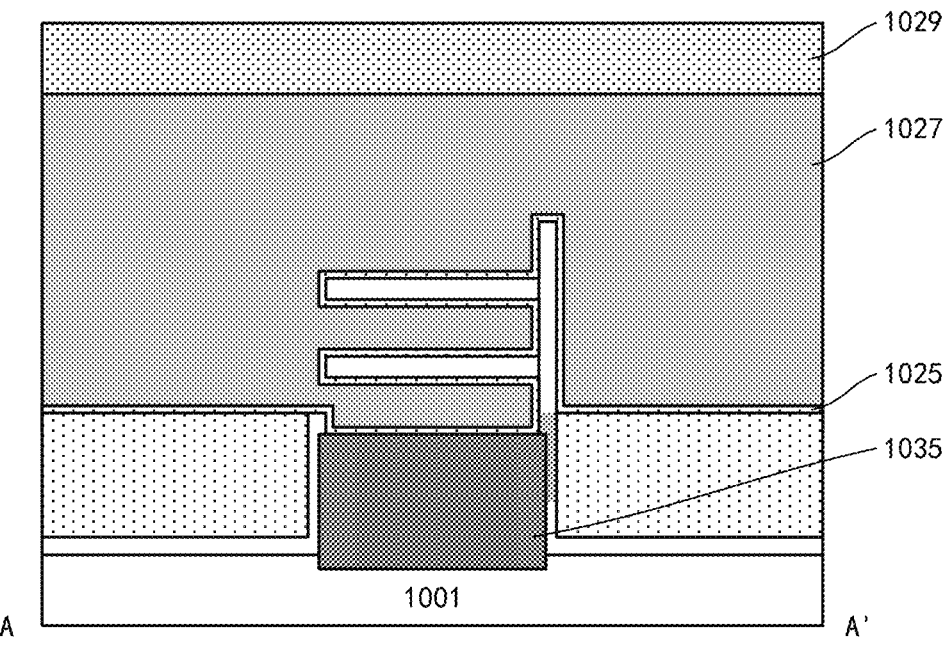
Figure 15B:
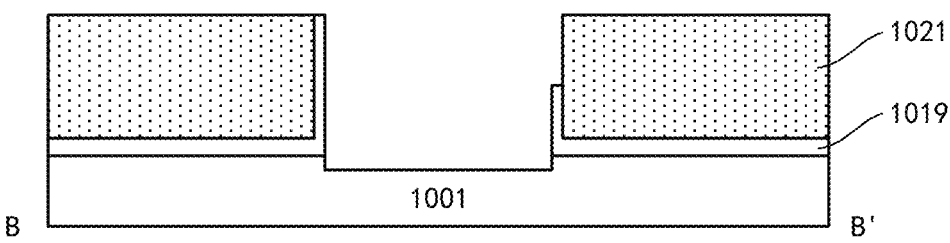
Figure 15C:
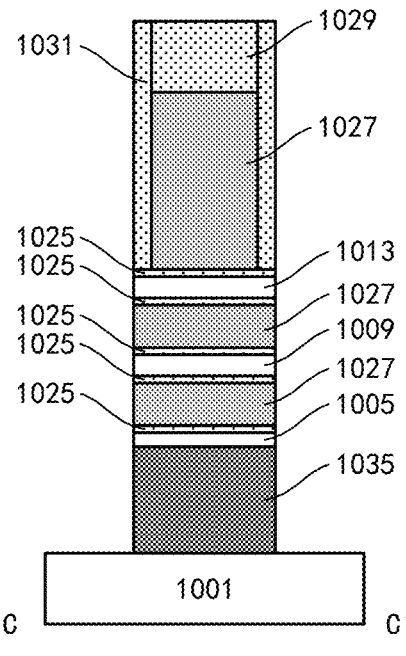
Figure 16A:
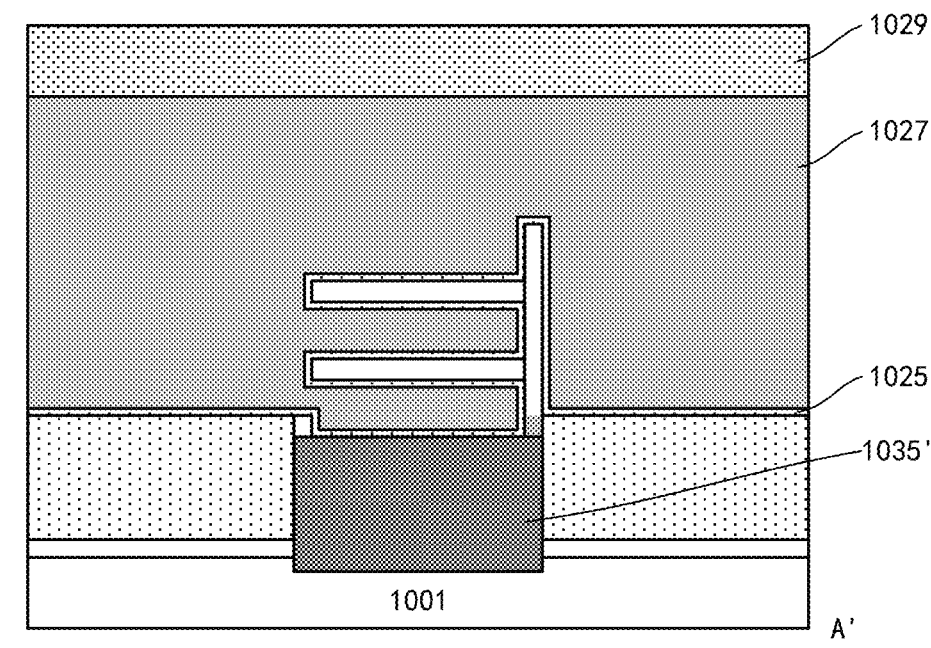
Figure 16B:
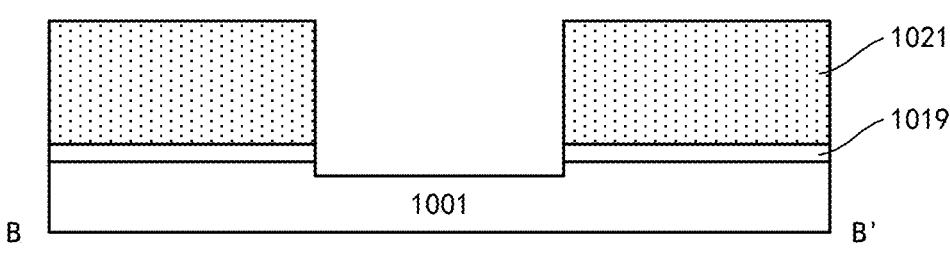
Figure 17A:
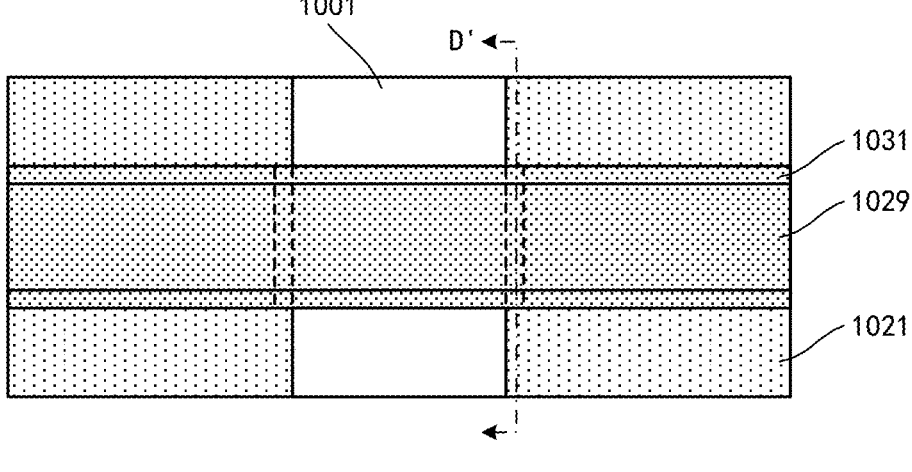
Figures 17B, 17C:
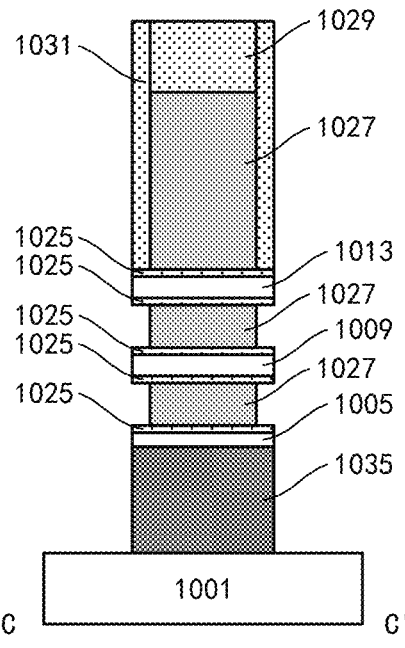

The aforementioned and other objectives, features and advantages would become more apparent through the following description of the embodiments of the present disclosure with reference to the accompany drawings, in the accompanying drawings:

FIGS. 1 to 22(b) schematically show some stages in the process of manufacturing a semiconductor device according to the embodiments of the present disclosure, wherein FIGS. 1 to 9, 10(b), 14(a), 15(a), 16(a), 19(a), 20(a), 21(a), and 22(a) are cross-sectional views along AA' line, FIGS. 10(a), 12(a) and 17(a) are top views, FIGS. 10(c), 11(a), 12(b), 13(a), 15(b), 16(b), 19(b), 20(b) and 21(b) are cross-sectional views along BB' line, FIGS. 10(d), 11(b), 12(c), 13(b), 14(b), 15(c), 17(b), 17(c), 18, 19(c), 20(c) and 21(c) are cross-sectional views along CC' line, and FIGS. 19(d), 20(d), 21(d) and 22(b) are cross-sectional views along DD' line.

Throughout the drawings, the same or similar reference numerals indicate the same or similar components.

DETAILED DESCRIPTION

Hereinafter, embodiments of the present disclosure will be described with reference to the drawings. However, it should be understood that these descriptions are only exemplary and are not intended to limit the scope of the present disclosure. In addition, in the following description, descriptions of well-known structures and technologies are omitted to avoid unnecessarily obscuring the concept of the present disclosure.

Various structural schematic diagrams according to embodiments of the present disclosure are shown in the drawings. The figures are not drawn to scale, some details are enlarged and some details may be omitted for clarity of presentation. The shapes of the various areas and layers shown in the figures and the relative size and positional relationships between them are only exemplary. In practice, there may be deviations due to manufacturing tolerances or technical limitations, and those skilled in the art may design regions/layers having different shapes, sizes, relative positions in addition according to actual needs.

In the context of the present disclosure, when a layer/element is referred to as being "on" another layer/element, the layer/element may be directly on the other layer/element, or there may be an intermediate layer/element between them. In addition, if a layer/element is located "on" another layer/element in one orientation, the layer/element may be located "under" the other layer/element when the orientation is reversed.

According to embodiments of the present disclosure, a semiconductor device having a channel of a comb-like structure. For example, the channel portion of the semiconductor device may include a first part extending in a vertical direction relative to a substrate (for example, a direction substantially perpendicular to a surface of the substrate), and a second part extending from the first portion in a lateral direction relative to the substrate (for example, a direction substantially parallel to the surface of the substrate). The second part may be spaced apart from the substrate. There may be a plurality of such second parts, which are spaced apart from each other in the vertical direction. The (each) second part may extend from the first part to a (same) side of the first part, for example, in the lateral direction relative to the substrate. As such, the entire channel portion may have a comb-like shape. A top surface of the first part may be higher than a top surface of the uppermost second part. The first part of the channel portion may be similar to a fin in a fin field effect transistor (FinFET), and the second part of the channel portion may be similar to a nanosheet in a nanosheet field effect transistor (FET) or multi-bridge channel field effect transistor (MBCFET).

Therefore, the semiconductor device according to the embodiment of the present disclosure may have advantages of both the FinET and the nanosheet FET or the MBCFET. In the semiconductor device, a current driving capability may be provided by the first part and the second part of the channel portion at the same time, thereby improving the device performance and reducing the area. In addition, since the first part and the second part are coupled to each other, a mechanical stability of the semiconductor device in the manufacturing stage is high, for example, higher than the mechanical stability of a conventional MBCFET.

The semiconductor device may further include source/drain portions arranged at two opposite sides of the channel portion, and the source/drain portions are in contact with the channel portion to form an active region of the semiconductor device. A longitudinal direction of the active region may be a first direction. The source/drain portions may include a material being the same as the material of the channel portion, or the source/drain portions may include a material being different from the material of the channel portion so as to, for example, apply stress to the channel portion to enhance the device performance. The source/drain portions may be grown from the substrate below and/or the sidewall of the channel portion. The top surface of the source/drain portion may be higher than the top surface of the channel portion.

The first part and/or the second part of the channel portion may include a single crystal semiconductor material to improve the device performance. For example, the first part and/or the second part of the channel portion may be formed by epitaxial growth, and thus their thickness may be better controlled. Of course, the source/drain portions may also include a single crystal semiconductor material. A crystal interface may be formed between at least some of the separately grown semiconductor layers. For example, at least one of an interface between the first part of the channel portion and the source/drain portions, an interface between the second part of the channel portion and the source/drain portions, and an interface between the first part and the second part of the channel portion may be an observable crystal interface.

The semiconductor device may further include a gate stack intersecting the channel portion. The gate stack may extend in a second direction intersecting (for example, perpendicular to) the first direction. The gate stack extends from one side of the channel portion to the other side of the channel portion, crossing the channel portion. The gate stack may enter a gap between each second part of the channel portion (in a case where there are a plurality of second parts), and a gap between the lowermost second part and the substrate. Thus, the gate stack may be in contact with opposite sidewalls and a top surface of the first part of the channel portion, an upper and lower surfaces of the (each) second part, and a sidewall at a side of the (each) second part away from the first part, so as to define a channel region therein.

A spacer may be formed on sidewalls at two opposite sides of the gate stack in the first direction. The gate stack may be separated from the source/drain portions by the spacer. Sidewalls of the spacer facing each source/drain portion may be substantially coplanar in the vertical direction. The spacer may include a first part extending on both sides of the channel portion and on the uppermost second part of the channel portion, and a second part extending between the second parts of the channel portion (if there are a plurality of second parts) and between the lowest second part of the channel portion and the substrate. The first part and the second part of the spacer may include different materials. The first part and the second part of the spacer may have substantially the same thickness.

A first isolation portion may be arranged between the channel portion and the substrate. The gate stack, especially a part of the gate stack extending on a lower surface of the lowermost second part of the channel portion, may be formed on the first isolation portion. As described below, the first isolation portion may be formed under the channel portion by self-aligning with the gate stack. In the first direction, the first isolation portion may be interposed between the source/drain portions. In addition, a second isolation portion may be further arranged on the substrate, and the gate stack, especially a part of the gate stack extending at both sides of the channel portion, may be formed on the second isolation portion.

Below the first part of the channel portion, especially between the first isolation portion and the second isolation portion, a punch-through stopper (PTS) may be arranged, so as to suppress or even prevent a current leakage between the source/drain portions through a region below the first part. The PTS may be a semiconductor layer in contact with the substrate, and may be appropriately doped. The semiconductor layer in contact with the substrate may improve the heat dissipation performance of the device. Alternatively, the first isolation portion may extend below the first part of the channel portion, so as to suppress or even prevent the current leakage between the source/drain portions. The first isolation portion may extend in the second direction to be in contact with the second isolation portion.

The semiconductor device may be manufactured as follows, for example.

First, the comb-like channel portion may be provided on the substrate.

For example, a first sacrificial layer may be formed on the substrate. The first sacrificial layer may define a position of the first isolation portion. A lamination of at least one second sacrificial layer alternated with at least one first active layer may be formed on the first sacrificial layer. These layers may be formed by epitaxial growth. The first active layer may be used for forming the second part of the channel portion. The second sacrificial layer may be used for defining gaps (where the gate stack may be then formed) between the second part and the first isolation portion, and between respective second parts (if there exists the plurality of second parts). The uppermost layer of the lamination may be the second sacrificial layer, so as to ensure the contact between a later formed second active layer and each first active layer, especially an uppermost first active layer. The first sacrificial layer and the lamination may be patterned into a ridge-like structure extending in the first direction. In this way, the first active layer in the lamination may be formed into a nanosheet.

The second active layer in contact with the first active layer may be formed on a sidewall of the ridge-like structure, for example, at a side of the ridge-like structure in the second direction intersecting (for example, perpendicular to) the first direction. The second active layer may extend vertically on the sidewall of the ridge-like structure so as to be formed as a fin. For example, the second active layer may be formed by epitaxially growing a semiconductor layer from a surface of the substrate and a surface of the ridge-like structure and patterning the semiconductor layer. The second isolation portion may be formed on a periphery of the ridge-like structure (with the second active layer formed on the sidewall) on the substrate, so as to form the gate stack on the second isolation portion subsequently. The second sacrificial layer may be removed. In this way, the first active layer and the second active layer form the comb-like structure.

Manufacturing of the semiconductor device may be continued based on the available comb-tooth structure.

As described above, the comb-like structure is used for the channel portion. The definition of the channel portion and the formation of the gate stack may be performed in combination. For example, the gate stack that extends in the second direction to intersect the first active layer and the second active layer may be formed on the substrate, especially on the second isolation portion. The gate stack may be used as a mask to pattern the comb-like structure, so that the comb-like structure is left under the gate stack to form the channel portion, and exposed parts on both sides of the gate stack may be removed.

Due to the patterning of the comb-like structure, the first sacrificial layer may be exposed on both sides of the gate stack. The first sacrificial layer may be removed, leaving an interspace under the channel portion. In this interspace, the first isolation portion may be formed. When the first isolation portion is formed, the gate stack may be used as a mask for patterning, so that the first isolation portion may be self-aligned with the gate stack.

On both sides of the gate stack in the first direction on the substrate, the source/drain portions in contact with the first active layer and the second active layer may be formed by, for example, epitaxial growth.

The gate stack formed as described above may be a sacrificial gate stack. The sacrificial gate stack may be replaced with a real gate stack through a replacement gate process.

The present disclosure may be presented in various forms, some examples of which will be described below. In the following description, selection of various materials is involved. In addition to the function thereof (for example, semiconductor materials are used for forming active areas and dielectric materials are used for forming electrical isolation), the selection of materials also considers etching selectivity. In the following description, the required etching selectivity may be or may not be indicated. It should be clear to those skilled in the art that when etching a certain material layer is mentioned below, if it is not mentioned that other layers are also etched or the figures do not show that other layers are also etched, then the etching may be selective, and the material layer may have etching selectivity relative to the other layers exposed to the same etching recipe.

FIGS. 1 to 22($b$) schematically show some stages in a process of manufacturing a vertical semiconductor device according to an embodiment of the present disclosure.

As shown in FIG. 1, a substrate 1001 is provided. The substrate 1001 may be a substrate in various forms, including but not limited to a bulk semiconductor material substrate such as a bulk Si substrate, a semiconductor-on-insulator (SOI) substrate, a compound semiconductor substrate such as SiGe substrates, and the like. In the following description, for convenience of description, a bulk Si substrate is taken as an example for description.

In the substrate 1001, a well region (not shown) may be formed. If a p-type device is to be formed, the well region may be an n-type well. If an n-type device is to be formed, the well region may be a p-type well. The well region may be formed by, for example, implanting corresponding conductivity type dopants (p-type dopants such as B or In, or n-type dopants such as As or P) into the substrate 1001 and then performing thermal annealing. There are many ways to provide such a well region in the art, which will not be repeated here.

On the substrate 1001, the first sacrificial layer 1003 may be formed by, for example, epitaxial growth. The first sacrificial layer 1003 may then be used to define the first isolation portion, and has a thickness of, for example, about 10 nm-30 nm. In addition, for a better etching control, an etch stop layer 1005 may be formed on the first sacrificial layer 1003 by, for example, epitaxial growth. The etch stop layer 1005 may be relatively thin, for example has a thickness of about 2 nm-5 nm. On the etch stop layer 1005, a lamination of the second sacrificial layers 1007, 1011 and 1015 alternated with the first active layers 1009 and 1013 may be formed by, for example, epitaxial growth. The first active layers 1009 and 1013 may then form nanosheets of the channel portion, with thicknesses of, for example, about 5 nm-15 nm. In generating the first active layers 1009 and 1013, in-situ doping may be performed to adjust a threshold of the device. The second sacrificial layers 1007 and 1011 may define a gap between the nanosheets, and have a thickness of, for example, about 10 nm-25 nm. An uppermost second sacrificial layer 1015 may be slightly thinner, for example has a thickness of about 10 nm-20 nm. The number of the second sacrificial layer(s) and the number of the first active layer(s) in the lamination may vary according to a device design, for example, be larger or smaller.

Among the substrate 1001 and the above-mentioned layers formed thereon, adjacent layers may have etching selectivity relative to each other. For example, the first sacrificial layer 1003 and the second sacrificial layers 1007, 1011 and 1015 may include SiGe (for example, an atomic percentage of Ge is about 10%-30%), and the etch stop layer 1005 and the first active layers 1009 and 1013 may Include Si.

On the above-mentioned lamination, a hard mask layer 1017 may be formed by, for example, deposition. For example, the hard mask layer 1017 may include nitride (for example, silicon nitride) and has a thickness of about 30 nm-150 nm. Before the nitride hard mask layer 1017 is deposited, a thin etch stop layer or protective layer (not shown) made of, for example, an oxide (for example, a silicon oxide) or other materials may be formed by, for example, deposition. Alternatively, the hard mask layer 1017 may also include an oxide, SiC, or the like.

Figure 2:
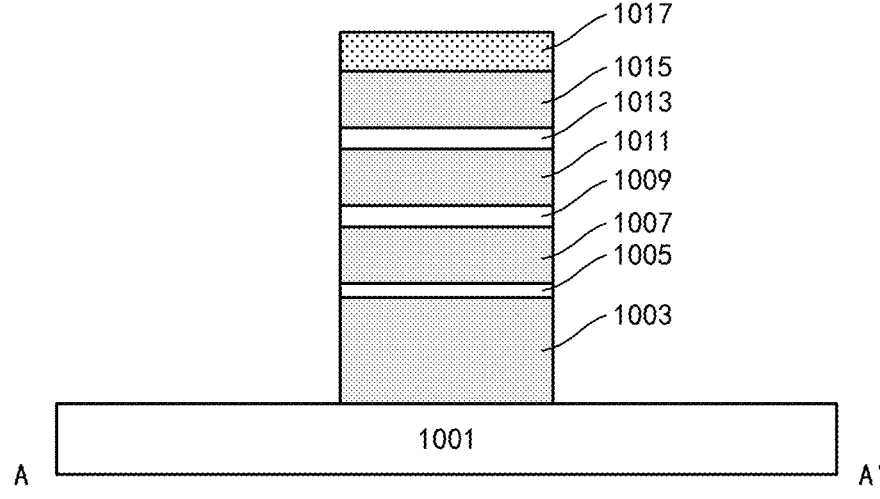

As shown in FIG. 2, the active area may be defined by patterning the first sacrificial layer 1003 and the above-mentioned lamination above the first sacrificial layer 1003 into the ridge-like structure. For example, a photoresist (not shown) may be formed on the hard mask layer 1017, and then patterned as a bar extending along the first direction (the direction into the paper surface in the figure) by photolithography. Then, the photoresist may be used as an etching mask to selectively etch each layer in sequence by, for example, reactive ion etching (RIE), such that the photoresist pattern is transferred to an underlying layer. The etching may stop at the substrate 1001. Thus, the lamination of the first sacrificial layer 1003, the etch stop layer 1005, the second sacrificial layers 1007, 1011 and 1015, and the first active layers 1009 and 1013 may form the ridge-like structure extending along the first direction. A size of the ridge-like structure to be formed may be determined according to a size of the nanosheet in the semiconductor device to be formed.

Figures 3, 4:
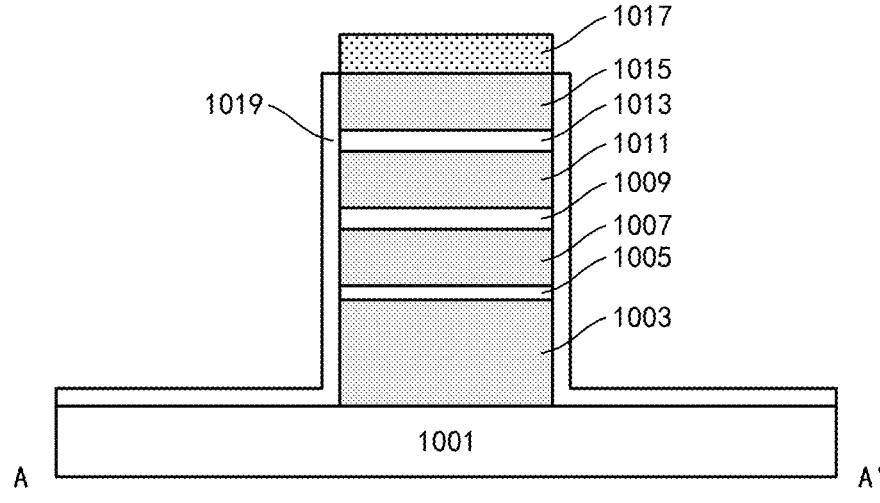

As shown in FIG. 3, the second active layer 1019 may be formed on a sidewall of the ridge-like structure by, for example, selective epitaxial growth. Due to the selective epitaxial growth, the second active layer 1019 may be formed on the vertical sidewall of the ridge-like structure and the surface of the substrate 1001. The second active layer 1019 may then form the fin of the channel portion, with a thickness of, for example, about 5 nm-15 nm. Unlike a thickness of a fin in a conventional FinFET, which is usually determined by an etching process, according to the embodiment of the present disclosure, the thickness of the second active layer 1019 (which then serves as a fin) may be determined by an epitaxial growth process, and thus the thickness of the fin may be better controlled.

In this example, the first active layer and the second active layer may include the same material (Si). However, the present disclosure is not limited to this. For example, the first active layer and the second active layer may include different semiconductor materials, so that respective threshold voltages of the first part and the second part of the obtained channel portion may be adjusted to match with each other. Additionally or alternatively, the first active layer and the second active layer may include different doping concentrations and/or different doping impurities (for example, impurities of different conductivity types), so as to adjust the respective threshold voltages of the first part and the second part of the obtained channel portion. The reason is that, if the mechanical stability of the structure is taken into consideration, the first active layer and the second active layer may have different thicknesses, which will cause a difference or mismatch between the threshold voltages of the first part and the second part of the channel portion. In addition, a T-shaped structure formed by the first part and the second part may also affect an electric field distribution and thus the threshold voltages.

As shown in FIG. 4, an isolation layer 1021 (the above-mentioned second isolation portion) may be formed around the active region. The isolation layer 1021 may be a shallow trench isolation (STI) defining the active region. For example, an oxide layer that completely covers the ridge-like structure is formed on the substrate 1001 by deposition, and the oxide layer is etched back to form the isolation layer 1021. Before the etch-back, a planarization processing such as chemical mechanical polishing (CMP), may be performed to the deposited oxide layer, and the CMP may stop at the hard mask layer 1017. After the etch-back, a top surface of the isolation layer 1021 may be lower than a bottom surface of a lowermost first active layer 1009, and higher than a top surface of the first sacrificial layer 1003, for example, between a top surface and a bottom surface of a lowermost second sacrificial layer 1007.

Figure 5:
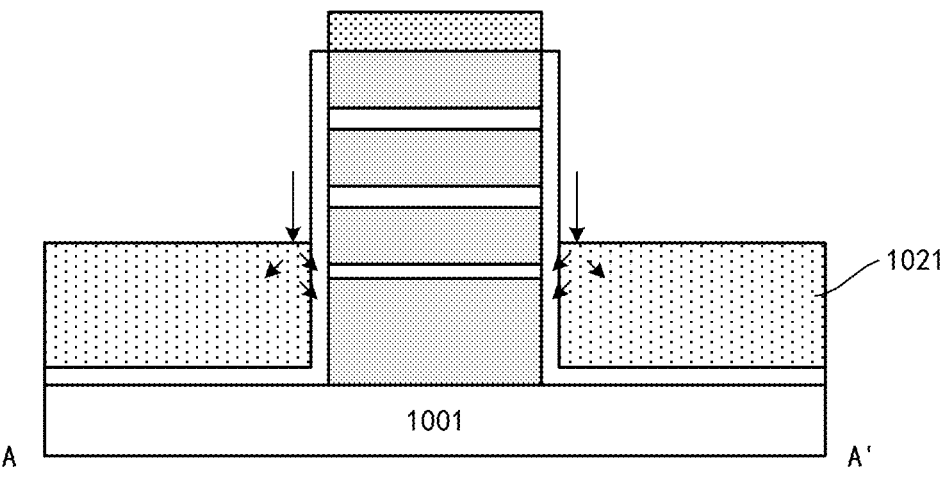

In addition, in order to suppress the leakage current, the penetration stopper (PTS) (referring to 1023 shown in FIG. 8) is formed in the second active layer 1019, especially in a part of the second active layer 1019 below the top surface of the isolation layer 1021 (i.e., in the second active layer 1019, a part below a part used as the channel). The PTS may be formed with the help of the isolation layer 1021. As shown in FIG. 5, an ion may be implanted towards the isolation layer 1021. The ions implanted into the isolation layer 1021 may be scattered into a part of the second active layer 1019 adjacent to the isolation layer 1021. The implanted ions may have a conductivity type opposite to a conductivity type of the device to be formed. For example, a for n-type device, p-type dopants such as B or In may be implanted; and for a p-type device, n-type dopants such as As or P may be implanted. The dose of the implantation may be about 1E17-1E19 cm$^{-3}$. Annealing may be performed at a temperature of about 750-1050° C., to activate the implanted dopants.

Figure 6:
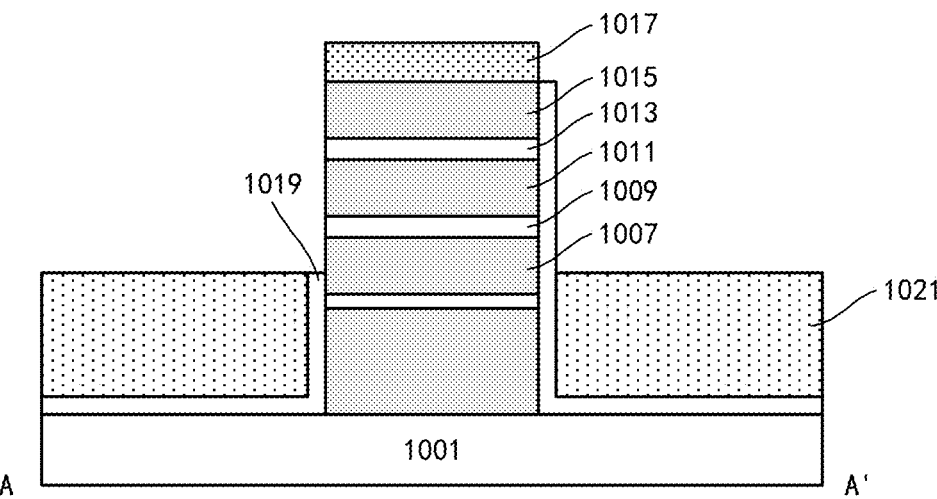

In order to enable the subsequently formed gate stack to enter a space between the first active layers 1009 and 1013, and a space below the lowermost first active layer 1009, a part on a sidewall of the ridge-like structure at a side of the ridge-like structure (for example, the left side in the figure) in the second direction intersecting the first direction (for example, the horizontal direction on the paper in FIG. 5), is removed from the second active layer 1019. For example, as shown in FIG. 6, a photoresist (not shown) may be used to shield a part on a sidewall at the other side of the ridge-like structure (for example, the right side in the figure) in the second direction, and an exposed part of the second active layer 1019 is removed by selective etching such as RIE. After that, the photoresist may be removed. In addition, in order to protect the remaining second active layer 1019, a protective layer (for example, a thin oxide layer) may be formed on a surface of the remaining second active layer 1019.

Figure 7:
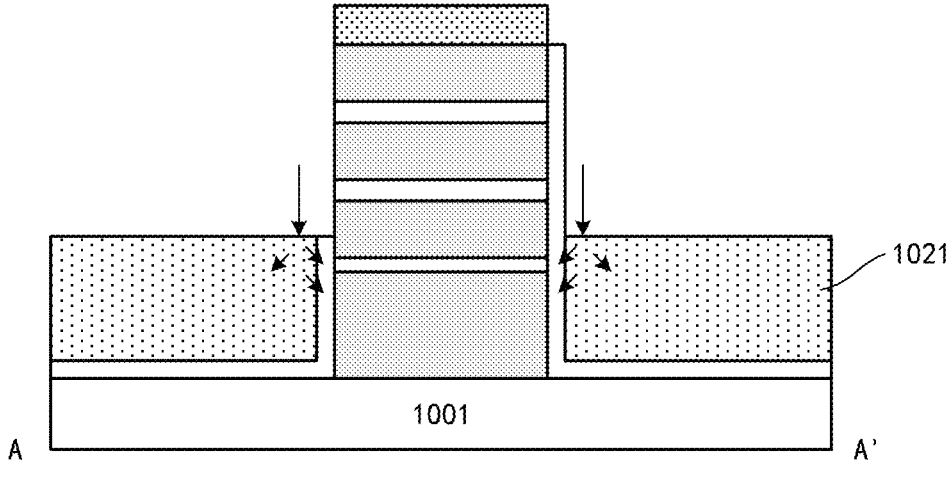

In the above embodiment, the PTS implantation is performed before the second active layer 1019 is patterned. However, the present disclosure is not limited to this. For example, as shown in FIG. 7, the second active layer 1019 may be patterned before the PTS implantation is performed.

Figure 8:
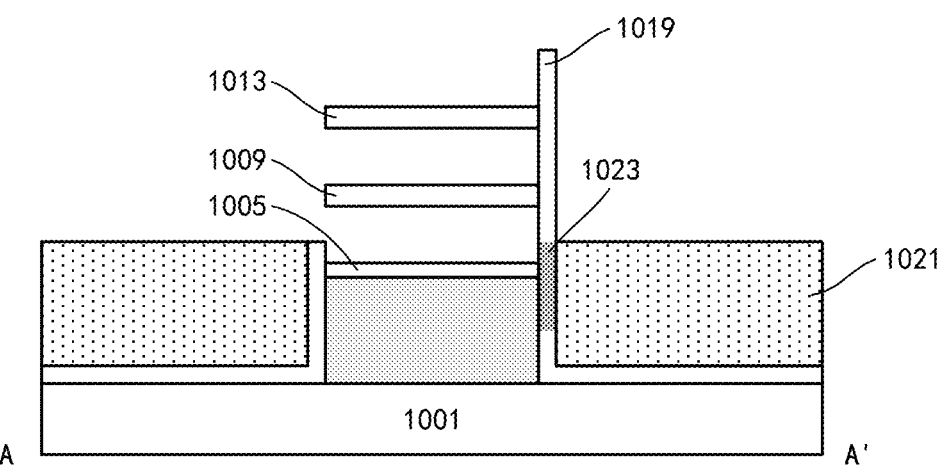

As shown in FIG. 8, the hard mask layer 1017 may be removed by selective etching such as wet etching using hot phosphoric acid. In addition, the second sacrificial layers 1007, 1011 and 1015 of SiGe may be selectively etched relative to the first active layers 1009 and 1013, the second active layer 1019 and the etch stop layer 1005 of Si, so as to remove them. In this way, a comb-like structure is obtained. As shown in FIG. 8, the comb-like structure includes a first part 1019 extending in the vertical direction, and second parts 1009 and 1013 that extend from the first part 1019 in the lateral direction. In this example, there are two second parts. However, the present disclosure is not limited to this, and the number of the second part(s) may be greater (for example, 3 or more) or less (for example, 1).

In this embodiment, the etch stop layer 1005 may help define a position of a lower surface of the gate stack to be formed later or the position of an upper surface of the first isolation portion to be formed later. However, the present disclosure is not limited to this. If the first sacrificial layer 1003 includes a material having an etch selectivity relative to the second sacrificial layers 1007, 1011 and 1015, the etch stop layer 1005 may be omitted.

As shown in FIG. 9, a sacrificial gate stack may be formed on the isolation layer 1021. The sacrificial gate stack may include a sacrificial gate dielectric layer 1025 and a sacrificial gate conductor layer 1027. The sacrificial gate dielectric layer 1025 may include an oxide, for example, formed by deposition or thermal oxidation. The sacrificial gate conductor layer 1027 may include polycrystalline SiGe (with atomic percentage of Ge being about 10%-40%), for example, formed by deposition and planarization such as CMP which is performed after the deposition. Due to the removal of the second sacrificial layer, the formed sacrificial gate stack may surround the first active layers 1009 and 1013 and a part of the second active layer 1019 above the top surface of the isolation layer 1021. In this example, both the sacrificial gate dielectric layer 1025 and the isolation layer 1021 include an oxide, and thus they may appear to be integrated.

As shown in FIGS. 10(*a*) to 10(*d*), the sacrificial gate stack may be patterned into a bar extending in the second direction. Specifically, a hard mask layer 1029 may be formed on the sacrificial gate stack. The hard mask layer 1029 may include a nitride, with a thickness of, for example, about 15 nm-150 nm. A photoresist (not shown) may be formed on the hard mask layer 1029 and patterned into a bar extending in the second direction by photolithography (referring to the top view of FIG. 10(*a*)). Then, the photoresist may be used as an etching mask, and the hard mask layer 1029 and the sacrificial gate conductor layer 1027 are selectively etched sequentially by, for example, RIE. The selective etching may stop at the sacrificial gate dielectric layer 1025 of oxide.

Referring to FIG. 10(*c*), in the first direction, on opposite sides of the bar-like hard mask layer 1029 that extends in the second direction (i.e., the upper and lower sides of the bar-like hard mask layer 1029 in the top view of FIG. 10(*a*)), a part of the sacrificial gate conductor layer 1027 under each first active layer may be left due to an existence of the first active layer.

As shown in FIGS. 11(*a*) and 11(*b*), a first spacer 1031 may be formed on a sidewall of the sacrificial gate stack. For example, a layer of nitride, a thickness of which is about 1 nm-3 nm, may be deposited in a substantially conformal manner, and then anisotropic etching may be performed on the deposited nitride layer in the vertical direction, so as to remove a lateral extension part of the deposited nitride layer and leave a vertical extension part of the deposited nitride layer, thereby obtaining the first spacer 1031. Before the nitride layer is deposited, an etch stop layer may also be formed, for example, by deposition, and the etching of the nitride layer may stop at the etch stop layer. Since the ridge-like structure (currently including the first active layer, the second active layer and the remaining sacrificial gate stack) also has a vertical sidewall, the first spacer may also be formed on the sidewall of the ridge-like structure, as shown in FIG. 11(*a*).

As shown in FIGS. 12(*a*) to 12(*c*), a part of the first active layer and a part of the second active layer, which are located at both sides of the bar-like hard mask layer 1029 and the first spacer 1031 on the sidewall of the bar-like hard mask layer 1029, may be removed. For example, referring to FIGS. 10(*c*) and 12(*b*), the sacrificial gate dielectric layer, the first active layer 1013, the sacrificial gate dielectric layer, the sacrificial gate conductor layer, and the sacrificial gate dielectric layer, the first active layer 1009, the sacrificial gate dielectric layer, the sacrificial gate conductor layer, and the sacrificial gate dielectric layer may be selectively etched sequentially by, for example, RIE. In this way, the sacrificial gate stack may be formed as a bar corresponding to the hard mask layer 1029 and extending in the second direction. As a result of the above processing, the ridge-like structure is substantially removed (except that a part of the first sacrificial layer 1003 is left at both ends of the ridge-like structure) except a part of the ridge-like structure under the sacrificial gate stack and the first spacer formed on the sidewall of the sacrificial gate stack. Accordingly, the first spacer on the sidewall of the ridge-like structure will not be left in the etching process due to a loss of support, although a separate etching process is not performed for the first spacer of nitride here. In addition, the comb-like structure is also left under the sacrificial gate stack and the first spacer formed on the sidewall thereof to form the comb-like channel portion. The second parts of the channel portion, that is, the respective first active layers, may have substantially the same shape, and may be substantially aligned with each other in the vertical direction. In addition, the stop layer 1005 may be selectively etched by, for example, RIE, so as to expose the first sacrificial layer 1003 under the stop layer 1005. The exposed first sacrificial layer 1003 may be partially etched, so that a protective layer (referring to 1033 shown in FIGS. 13(*a*) and 13(*b*)) formed later may completely cover the channel portion and the sidewall of the sacrificial gate stack, as shown in FIG. 12(*c*).

As shown in FIG. 12(*c*), the sidewall of the comb-like channel portion in the first direction is currently exposed to the outside. In order to protect the channel portion (especially during the following process of forming an isolation portion), as shown in FIGS. 13(*a*) and 13(*b*), a protective layer 1033 may be formed on the sidewall of the channel portion exposed to the outside. For example, the protective layer 1033 may include SiC. The protective layer 1033 may be formed by a spacer process, and therefore may exist on each vertical sidewall. Here, it should be noted that, if the channel portion cannot substantially be etched by the following etching recipe to which it is exposed (that is, it has etching selectivity), then this protective layer 1033 may also be omitted.

As shown in FIGS. 14(*a*) and 14(*b*), the first sacrificial layer 1003 may be selectively etched relative to the etching stop layer 1005 of Si and the substrate 1001 (and the protective layer 1033 of SiC), so as to remove it. In this way, a void is formed in the active region surrounded by the isolation layer 1021, and the surface of the substrate 1001 is exposed in the interspace.

As shown in FIGS. 15(*a*) to 15(*c*), in the interspace, an isolation portion 1035 (the above-mentioned first isolation portion) may be formed. In the case where the etching stop layer 1005 is formed, the etching stop layer 1005 may be removed by selective etching in order to reduce capacitance between a gate conductor to be formed later and the substrate 1001. In this example, since all of the etch stop layer 1005, the second active layer 1009 and the substrate 1001 include Si, the second active layer 1009 and the substrate 1001 may be etched when the etch stop layer 1005 is selectively etched. In the example shown in FIGS. 15(*a*) to 15(*c*), the second active layer 1009 on both sides of the interspace is partly left, instead of being completely removed. The isolation portion 1035 may be formed by depositing a dielectric material such as SiC, and then etching it back. When the deposited dielectric material is etched back, the isolation portion 1035 may be self-aligned with the sacrificial gate stack (and the first spacer on the sidewall of the sacrificial gate stack) due to the hard mask layer 1029 and the first spacer 1031 on the sidewall of the hard mask layer 1029. In addition, due to the etch-back, the previously formed protective layer 1033 of SiC may be removed, and thus the sidewall of the channel portion is exposed again. Referring to FIG. 15(*a*), both the isolation portion 1035 and the PTS exist under the first part of the channel portion.

According to another embodiment of the present disclosure, as shown in FIGS. 16(*a*) and 16(*b*), when the etch stop layer 1005 is removed, the second active layer 1009 on both sides of the interspace may be completely etched. In this way, referring to FIG. 16(*a*), the formed isolation portion 1035' may be in contact with the isolation layer 1021 on opposite sides in the second direction (the horizontal direction in the figure). In this case, the above-mentioned PTS formation process may be omitted, since the isolation portion 1035' may also play a role in suppressing the leakage current.

Thereafter, source/drain portions in contact with the exposed sidewall of the channel portion may be formed in the interspace on both sides of the sacrificial gate stack (and the first spacer on the sidewall thereof).

Figure 18:
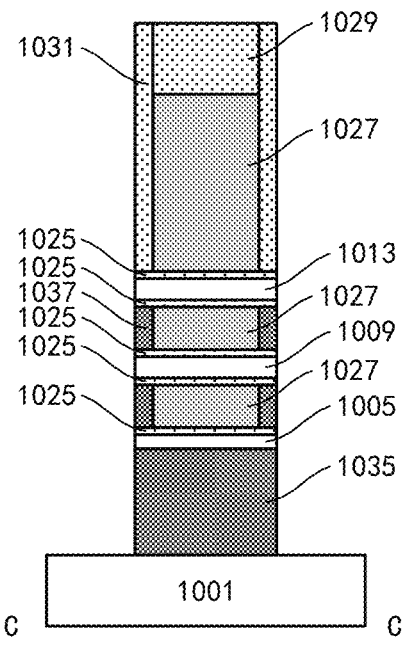
Figure 19A:
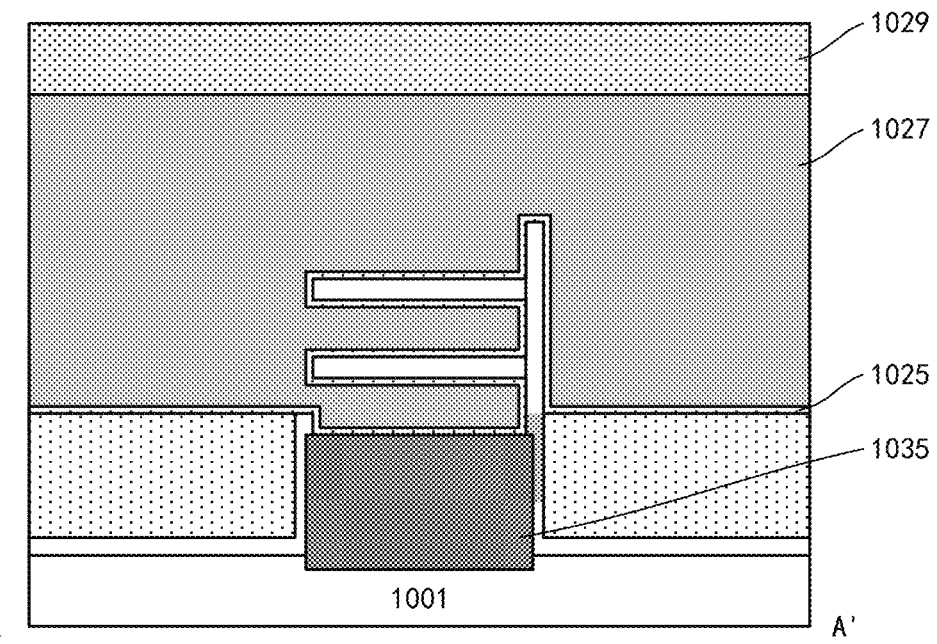
Figure 19B:
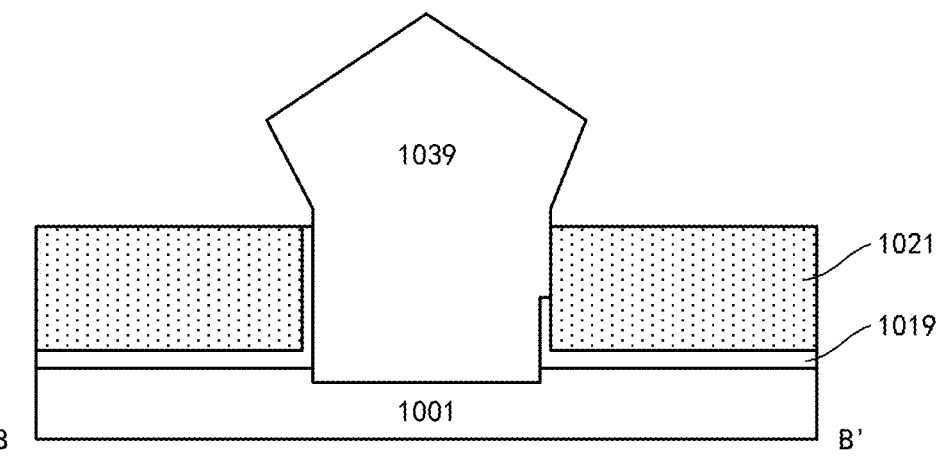
Figure 19C:
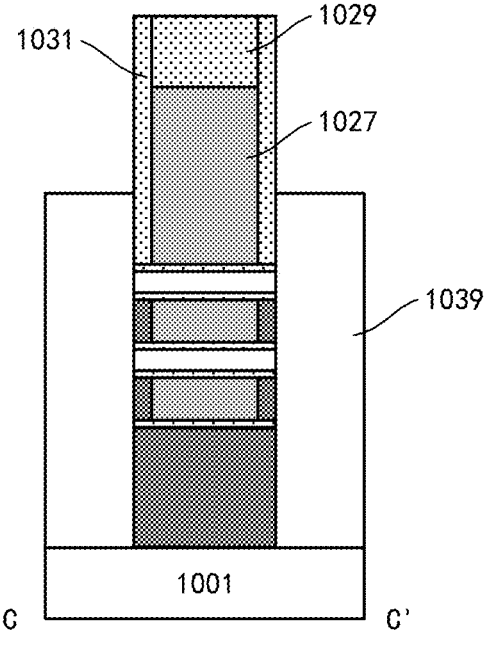
Figures 19D, 20A:
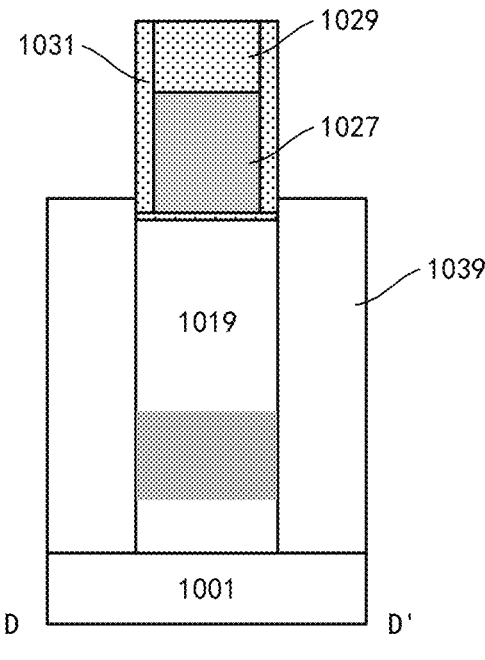
Figures 20B, 20C:
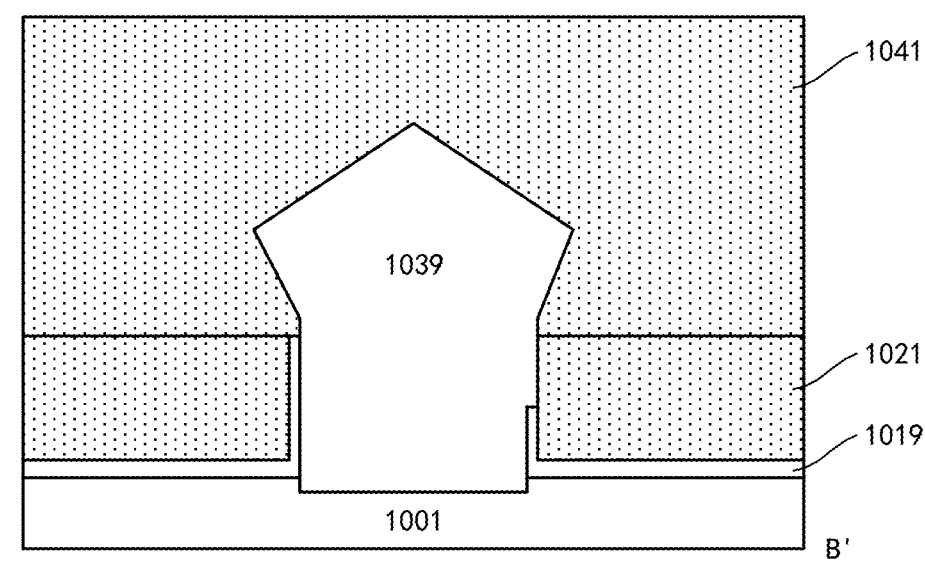
Figure 20D:
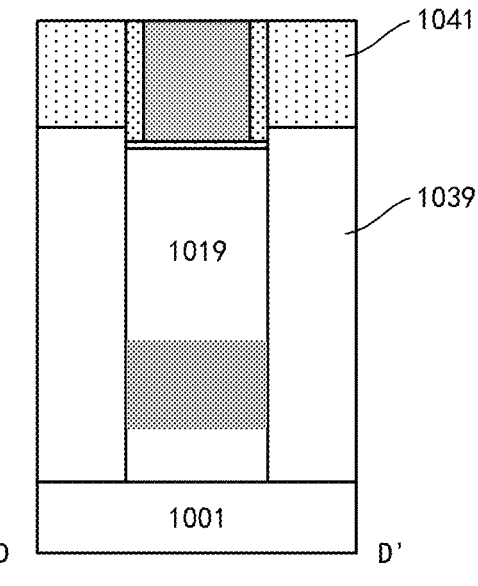
Figure 21A:
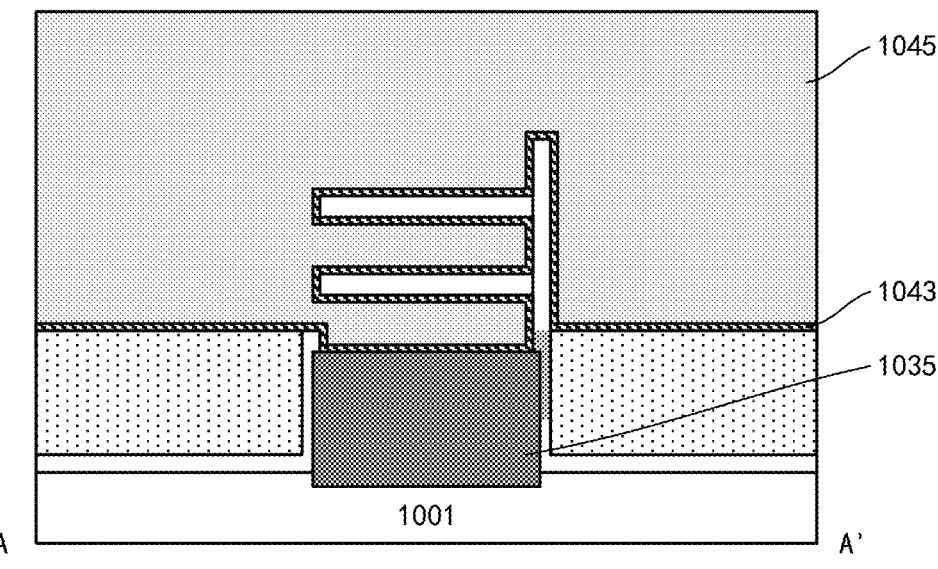
Figure 21B:
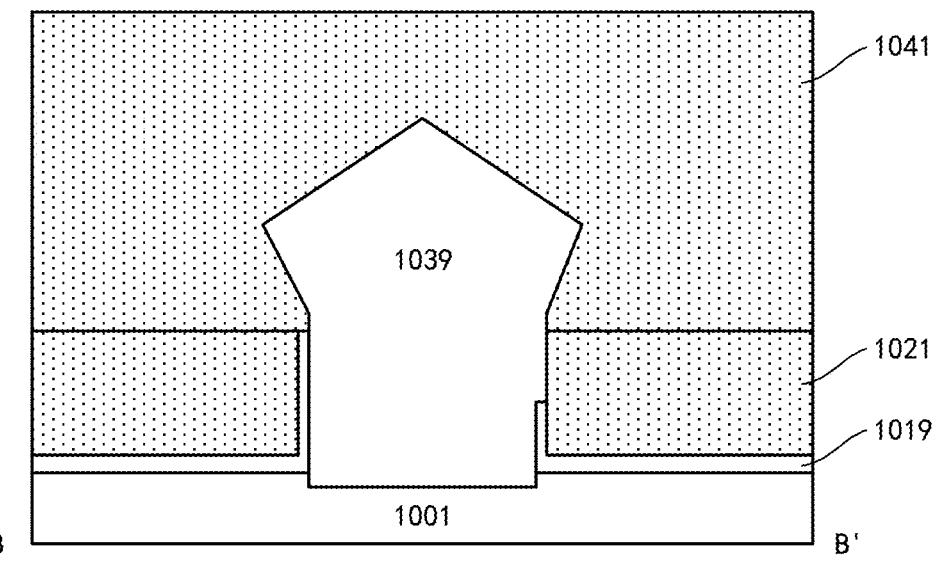
Figure 21C:
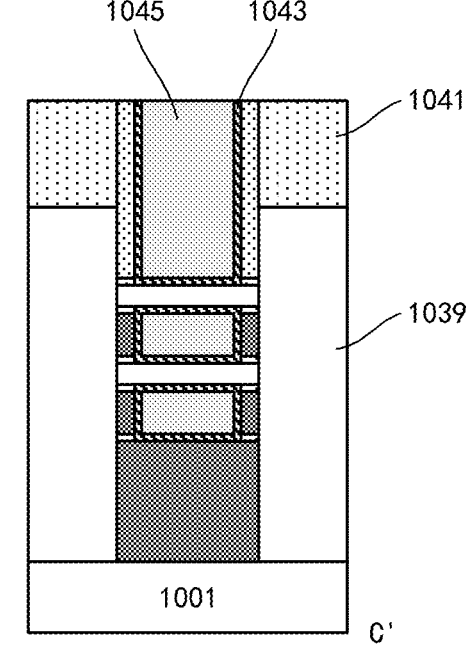
Figure 21D:
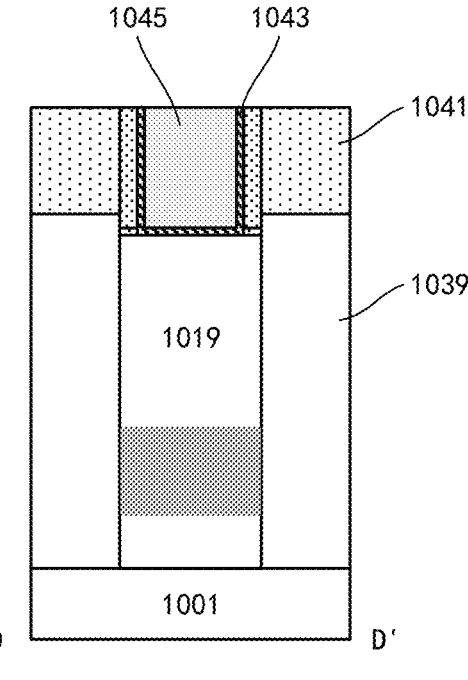
Figure 22A:
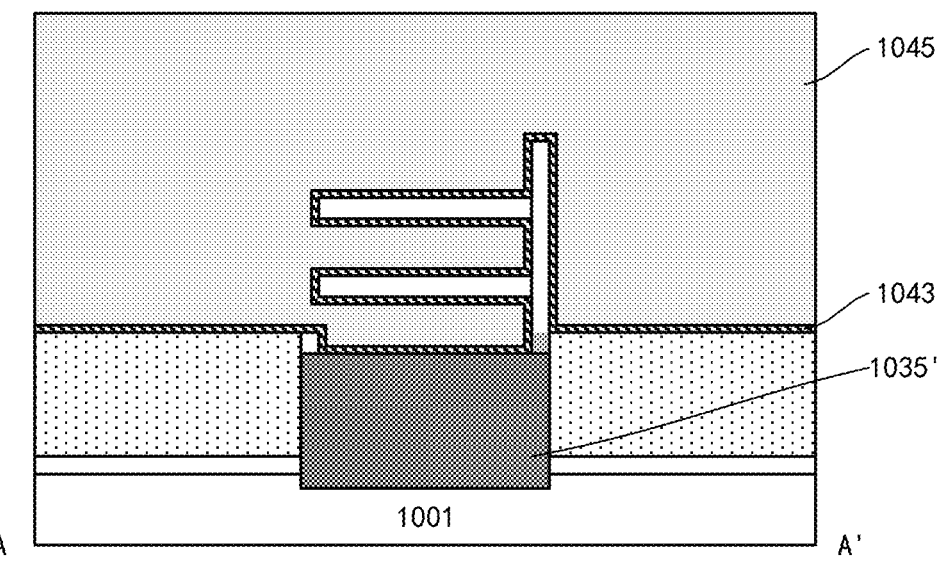
Figure 22B:
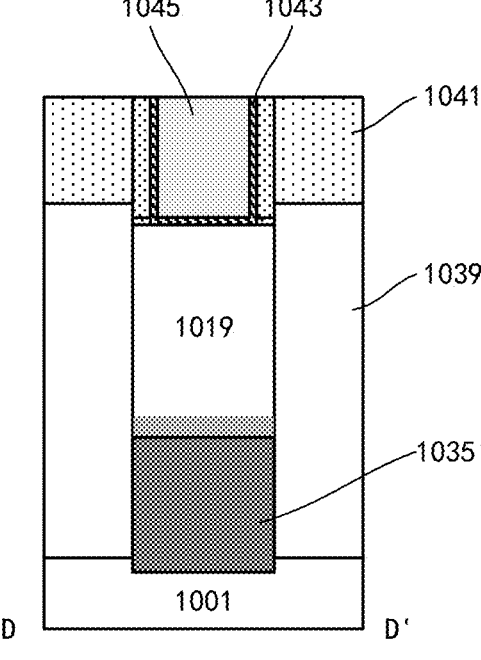

In order to reduce the capacitance between the gate stack to be formed later and the source/drain portions, a dielectric may be further inserted between the gate stack and the source/drain portions. For this purpose, as shown in FIGS. 17(*a*) to 17(*c*), the sacrificial gate conductor layer 1027 may be selectively etched (here, the etching may be isotropic etching) to make it relatively recessed. Here, atomic layer etching (ALE) may be employed in order to well control an etching depth. The sacrificial gate conductor layer 1027 may have substantially the same degree of recession everywhere. Then, as shown in FIG. 18, a second spacer 1037 may be formed on the sidewall of the sacrificial gate conductor layer 1027 that is relatively recessed. The second spacer 1037 may be formed by depositing and then etching back. Therefore, an outer sidewall of the second spacer 1037 may be substantially aligned with an outer sidewall of the first spacer 1031. For example, the second spacer 1037 may include a low-k dielectric material such as SiC. According to the embodiment of the present disclosure, the etching depth of the sacrificial gate conductor layer 1027 may be controlled, so that a thickness of the formed second spacer 1037 is substantially the same as a thickness of the first spacer 1031, therefore the sacrificial gate stack (and the gate stack later formed based on the sacrificial gate stack) may have substantially the same gate length.

As shown in FIGS. 19(*a*) to 19(*d*), source/drain portions 1039 may be formed by, for example, epitaxial growth. The source/drain portions 1039 may grow from the exposed surface of the substrate 1001 and an exposed surface of each of the first active layer and the second active layer. During growth, the source/drain portions 1039 may be doped in-situ to have a conductivity type corresponding to the device to be formed, for example, n-type for n-type device and p-type for p-type device. The grown source/drain portions 1039 may have a material different from the material of the channel portion (for example, have a lattice constant different from the lattice constant of the channel portion), so as to apply stress to the channel portion. For example, for an n-type device, the source/drain portions 1039 may include Si:C (for example, with an atomic percentage of C being about 0.5%-3%); for a p-type device, the source/drain portions 1039 may include SiGe (for example, with an atomic percentage of Ge being about 10%-75%).

On each of the opposite sides of the sacrificial gate stack, the source/drain portion 1039 is implemented to be integral. As shown in FIG. 19(*c*), similar to the MBCFET, each first active layer in form of nanosheet is connected between the source/drain portions 1039 on the opposite sides, in order to form the second parts of the channel portion. In addition, as shown in FIG. 19(*d*), similar to the FinFET, the second active layer 1019 is connected between the source/drain portions 1039 on opposite sides in order to form the second part of the channel portion.

Next, a replacement gate process may be performed to complete the manufacturing of the device.

As shown in FIGS. 20(*a*) to 20(*d*), an interlayer dielectric layer 1041 may be formed on the substrate 1001, for example, by depositing a dielectric material such as an oxide, to cover the sacrificial gate stack, the source/drain portions 1039 and the isolation layer 1021. A planarization processing such as CMP may be performed on the interlayer dielectric layer 1041 to expose the sacrificial gate conductor layer 1027.

As shown in FIGS. 21(*a*) to 21(*d*), the sacrificial gate conductor layer 1027 and the sacrificial gate dielectric layer 1025 may be removed by selective etching, so that a space, in which the gate stack may be formed, is formed on the inner side of the first spacer 1031 and the inner side of the second spacer 1037. For example, the gate dielectric layer 1043 and the gate conductor layer 1045 may be formed in sequence by deposition and planarization such as CMP which is performed after the deposition. The gate dielectric layer 1043 may be formed in a substantially conformal manner, with a thickness of, for example, about 2-5 nm, and may include a high-k gate dielectric such as $HfO_2$. Before the high-k gate dielectric is formed, it is also possible to form an interface layer, for example, an oxide formed by an oxidation process, or deposition such as atomic layer deposition (ALD), on a surface of the channel portion. The interface layer has a thickness of about 0.2-2 nm. The gate conductor layer 1045 may include a work function adjusting metal such as TiN, TaN, and a gate conductive metal such as W.

FIGS. 22(*a*) and 22(*b*) show an embodiment in which an isolation portion 1035' is in contact with the isolation layer 1021 on both sides. The other aspects of this embodiment may be the same as those shown in FIGS. 21(*a*) to 21(*d*).

The semiconductor device according to the embodiments of the present disclosure may be applied to various electronic apparatuses. For example, it is possible to form an integrated circuit (IC) based on such a semiconductor device, and construct an electronic apparatus based on the integrated circuit. Therefore, the present disclosure also provides an electronic apparatus including the above-mentioned semiconductor device. The electronic apparatus may also include components such as a display screen matched with an integrated circuit and a wireless transceiver matched with an integrated circuit. Such the electronic apparatus includes smart phones, computers, tablet computers (PCs), wearable smart devices, mobile power supplies, and so on.

According to the embodiments of the present disclosure, a method of manufacturing a system on chip (SoC) is also provided. The method may include the method described above. Specifically, a variety of devices may be integrated on the chip, at least some of which are manufactured according to the method of the present disclosure.

In the above description, the technical details such as patterning and etching of each layer are not explained in detail. However, those skilled in the art should understand that various technical means may be used to form layers, regions, etc. In addition, in order to form the same structure, those skilled in the art may also design a method that is not completely the same as the method described above. In addition, although the respective embodiments are described above respectively, this does not mean that the measures in the respective embodiments cannot be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

I claim:

1. A semiconductor device, comprising:
a channel portion, comprising:
a first part extending in a vertical direction relative to a substrate; and
a plurality of second parts extending from the first part in a lateral direction relative to the substrate;
source/drain portions in contact with the channel portion on two opposite sides of the channel portion;
a gate stack intersecting the channel portion,
wherein a surface of a first portion of the substrate has a height in the vertical direction less than a height of a surface of a second portion of the substrate other than the first portion of the substrate in the vertical direction, an orthographic projection of the plurality of second parts of the channel portion on the substrate overlaps with the first portion of the substrate,
a first isolation portion formed on the first portion of the substrate;
a second isolation portion formed on the second portion of the substrate;
wherein an orthographic projection of a boundary between the first portion of the substrate and the second portion of the substrate overlaps with the first part of the channel portion.

2. The semiconductor device according to claim 1, wherein the plurality of second parts are spaced apart from each other in the vertical direction.

3. The semiconductor device according to claim 1, wherein the channel portion comprises a single crystal semiconductor material.

4. The semiconductor device according to claim 1, wherein at least one of an interface between the first part of the channel portion and the source/drain portions, an interface between the plurality of second parts of the channel portion and the source/drain portions, and an interface between the first part and the second part of the channel portion is a crystal interface.

5. The semiconductor device according to claim 1, wherein the first part is in a form of a fin, and the plurality of second parts is in the form of a nanosheet.

6. The semiconductor device according to claim 1, wherein the plurality of second parts substantially extend from the first part toward a same side of the first part in the lateral direction relative to the substrate.

7. The semiconductor device according to claim 6, wherein the plurality of second parts have a substantially same shape and are substantially aligned with each other in the vertical direction.

8. The semiconductor device according to claim 1, further comprising:
a spacer formed on sidewalls of the gate stack, wherein sidewalls of the spacer facing each source/drain portion are substantially coplanar in the vertical direction.

9. The semiconductor device according to claim 8, wherein the spacer comprises:
a first part extending on both sides of the channel portion and on an uppermost second part of the channel portion; and
a second part extending between the second parts of the channel portion and between a lowest second part of the channel portion and the substrate,
wherein the first part and the second part of the spacer comprise different materials.

10. The semiconductor device according to claim 1, wherein the gate stack extends on an upper surface and a lower surface of each second part, and a sidewall of a part of the gate stack that extends on the upper surface of each second part is substantially aligned to a sidewall of a part of the gate stack that extends on the lower surface of a corresponding second part in the vertical direction.

11. The semiconductor device according to claim 1, wherein a sidewall of a part of the gate stack that intersects the plurality of second parts of the channel portion is substantially aligned to a sidewall of a part of the gate stack that intersects the first part of the channel portion.

12. The semiconductor device according to claim 1, wherein a top surface of the first part of the channel portion is higher than a top surface of an uppermost second part.

13. The semiconductor device according to claim 1, further comprising: a wherein the first isolation portion is arranged between the channel portion and the substrate.

14. The semiconductor device according to claim 13, wherein the gate stack is formed on the first isolation portion and the second isolation portion.

15. The semiconductor device according to claim 14, further comprising: a punch-through stopper located below the first part of the channel portion between the first isolation portion and the second isolation portion.

16. The semiconductor device according to claim 15, wherein the punch-through stopper is a semiconductor in contact with the substrate.

17. The semiconductor device according to claim 16, wherein
the semiconductor device is an n-type device, and the semiconductor of the punch-through stopper is p-type doped; or

the semiconductor device is a p-type device, and the semiconductor of the punch-through stopper is n-type doped.

18. The semiconductor device according to claim 14, wherein the first isolation portion contacts with the second isolation portion in a longitudinal extension direction of the gate stack.

19. The semiconductor device according to claim 13, wherein the first part of the channel portion is isolated from the substrate by the first isolation portion.

20. The semiconductor device according to claim 13, wherein the first isolation part is located below the first part of the channel portion between the source/drain portions.

21. The semiconductor device according to claim 13, wherein a sidewall of the first isolation portion facing each source/drain portion is substantially parallel to a corresponding sidewall of the gate stack.

22. The semiconductor device according to claim 1, wherein the first part and the plurality of second parts of the channel portion comprise different semiconductor materials.

23. The semiconductor device according to claim 1, wherein the first part and the plurality of second parts of the channel portion have different doping concentrations and/or different doping impurities.

24. An electronic apparatus comprising the semiconductor device according to claim 1.

25. The electronic apparatus according to claim 24, wherein the electronic apparatus comprises a smart phone, a computer, a tablet, an artificial intelligence device, a wearable device, or a mobile power supply.

\* \* \* \* \*